United States Patent [19]

Tamburro

[11] 4,223,973
[45] Sep. 23, 1980

[54] CIRCUIT BOARD KEYING ARRANGEMENT

[75] Inventor: Peter J. Tamburro, Hanover Township, Morris County, N.J.

[73] Assignee: Bell Telephone Laboratories, Incorporated, Murray Hill, N.J.

[21] Appl. No.: 10,364

[22] Filed: Feb. 8, 1979

[51] Int. Cl.³ .................. H01R 13/64; H05R 1/07
[52] U.S. Cl. .................. 339/186 M; 339/75 MP; 339/176 MP
[58] Field of Search .............. 339/17 R, 17 C, 17 L, 339/17 M, 184 R, 184 M, 188 R, 188 M, 75 MP, 176 MP; 361/399, 411, 413, 414, 415, 412

[56] References Cited

U.S. PATENT DOCUMENTS

| | | | |
|---|---|---|---|
| 3,177,461 | 4/1965 | Hagan et al. | 339/184 M |
| 3,567,998 | 3/1971 | Ammerman | 339/17 L X |
| 3,869,185 | 3/1975 | Teagno | 339/75 M X |

OTHER PUBLICATIONS

Dwg. No. A-554460, "927A,D Connector Assembly", Western Electric Co. 3/7/67.
Dwg. A-554506, "908D Connector Assembly", Western Electric Co., 4/22/70.

Primary Examiner—Howard N. Goldberg
Assistant Examiner—Eugene F. Desmond
Attorney, Agent, or Firm—Jerry W. Herndon

[57] ABSTRACT

A keying arrangement is disclosed for circuit boards (FIG. 1:1) and receptacles (2, 3, 4) to prevent the insertion of boards into any but correct receptacles.

The two guide rails (2, 3) of a circuit board receptacle aggregately comprise at least two spring devices (13, 37) located at prescribed coded locations (A through H, A' through H') along the guide rails. Each spring device comprises a projection (15) and each board contains indentations (FIG. 1:17, FIG. 2:22) associated individually with different ones of the projections. The indentations are located on the board such that one receives its associated projection during insertion of an incorrect type of board to prohibit further insertion.

14 Claims, 6 Drawing Figures

CIRCUIT BOARD KEYING ARRANGEMENT

TECHNICAL FIELD

This invention relates to structural arrangements associated with plug-in circuit boards and circuit board receptacles to prevent the insertion of boards into any but correct receptacles.

BACKGROUND OF THE INVENTION

In general, many electronic systems are today designed as modular systems composed of large numbers of a few types of general and special purpose plug-in circuits. Typically, the circuits are contained on circuit boards which are inserted into receptacles containing connectors which electrically engage terminals on the boards. For economic reasons, the different types of boards that might be required in any system are usually compatible with all the receptacles of the system. This means, of course, that without some form of constraint, any of the boards may be physically inserted into any of the compatible receptacles of the system, irrespective of whether or not it is the correct type of board for the receptacle. This, in turn, endangers the reliability of any such system due to human error when replacing faulty boards and the like.

In general, it is known to provide keying arrangements in connection with many types of plug-in devices to prevent inadvertent misuse. A common example is the use of different orientations of terminals and contacts in male and female power plugs and receptacles for different voltage and current ratings. The extension of this general principle of keying to circuit boards is also known.

For example, U.S. Pat. No. 3,177,461, which issued to T. G. Hagan on Apr. 6, 1965, discloses one circuit board keying arrangement in which tubular members are colinearly mounted in a receptacle and on a circuit board with their axes parallel to the direction of insertion of the board into the receptacle. Each tubular member has a portion of its tubular section removed as if a cut were made through its axis from one end thereof partially along its length and then at right angles out to its tubular surface. These tubular members are manually rotated to prescribed positions and locked in place to form the unique keys. Only when the ends of the tubular members in the receptacle and on the board intermesh can a board be completely inserted into the receptacle.

Another known circuit board keying arrangement involves placing slots in coded locations at the terminal end of a board. The slots run parallel to the direction of board insertion. Thin wires are located in front of and across the receptacle connector and align with the slots in a correct board or block the final insertion of an incorrect board into the connector.

The foregoing prior art and variations thereof, although effective, often suffer from one or more of several disadvantages. Some require manual operations to arrange the keying on each board. This is particularly troublesome when large numbers of circuit boards are involved. Others require high precision in the manufacture and assembly of the keying members in order to achieve a satisfactory arrangement having sufficiently large numbers of unique keys. The board and receptacle space consumed by keying arrangements is often excessive. Most arrangements are also unsatisfactory for retrofitting into existing systems that do not have a keying arrangement on their boards and receptacles.

The foregoing problems of the prior art are partially solved in an arrangement by T. G. Grau and A. M. Wittenberg for which U.S. patent application Ser. No. 10,306 has been filed contemporaneously with the filing of this application. In the Grau et al. arrangement, a first projection is located on a board in one of a plurality of first coded locations. These locations are arranged colinearly along an edge of the board associated with a guide rail of the receptacle in the direction of insertion of the board into the receptacle. A second projection is located on the board in an associated one of a like plurality of second coded locations arranged colinearly along the opposite edge of the board associated with another guide rail. Each of the first locations is associated with a different one of the second locations and the associated first and second locations are ordered in opposite directions. Each pair of associated first and second locations defines a unique key. First and second stops associated, respectively, with the first and second projections are located on the guide rails in the receptacle in the same spacial relationship as the projection.

DISCLOSURE OF THE INVENTION

My invention further improves the features of the Grau et al arrangement. The two guide rails of a circuit board receptacle aggregately comprise at least two spring devices located at prescribed coded locations along the guide rails. Each spring device comprises a projection and each board contains at least two indentations associated individually with different ones of the spring devices. The indentations are located on a board such that one receives its associated projection during insertion of an incorrect type of board.

In a preferred embodiment, each spring device has first and second projections sequentially located in that order in the direction of insertion of a board. The second projection has an abrupt leading surface. First and second pairs of first and second indentations are located on a board, the first and second indentations of different pairs being associated, respectively, with the first and second projections of the first and second spring devices. The second indentation of a pair has an abrupt leading shoulder which functions with the abrupt leading surface of its associated second projection to prevent further insertion of an incorrect board. Each of the projections also functions with a board to prevent interaction between a projection and a non-associated indentation.

BRIEF DESCRIPTION OF THE DRAWING

In the drawing:

FIG. 6 shows an illustrative embodiment of a guide rail in which the spring devices are incorporated as an integral part of the guide rail.

DETAILED DESCRIPTION

Figure 1:
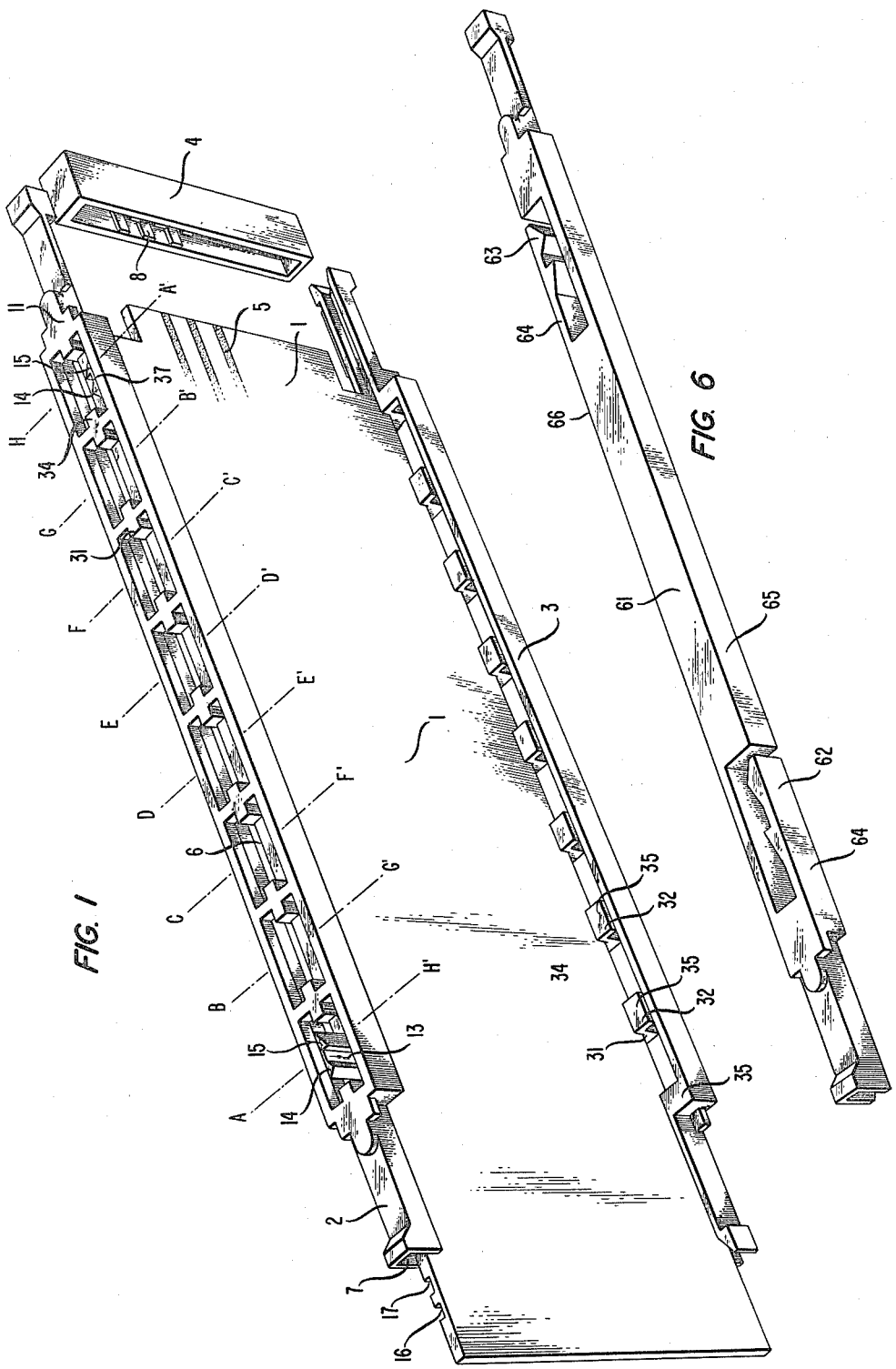
FIG. 1 is a perspective view of a board partially inserted along two guide rails of a receptacle. At least one of the guide rails contains a plurality of apertures defining a plurality of coded locations. Spring devices with projections are retained within prescribed ones of the locations to define circuit board keys.

FIG. 1 shows a perspective view of a circuit board 1 partially inserted into a receptacle. For purposes of this discussion, the receptacle may be considered to comprise two guide rails 2 and 3 and a connector 4. The guide rails are U-shaped to form a channel 7 extending the length of each guide rail and which receives an edge of the circuit board to support it and to guide it into alignment with connector 4.

When board 1 is completely inserted into the receptacle, terminals 5 on the board electrically engage mating contacts 8 in connector 4. Ordinarily, a plurality of the guide rails and connectors are arranged side-by-side in a frame housing in a well-known manner to provide a large number of receptacles. Electrical wiring is arranged in a desired manner to pins on the back of the connectors which are an integral part of the contacts 8 so that when the proper circuit boards are inserted into the receptacles, the overall structure operates as a complete circuit to accomplish a desired function.

Guide rail 2 has a plurality of apertures 6 which extend from the upper surface 11 completely through the guide rail. The locations of these apertures are coded and spring devices, such as 13 and 37, are inserted into selected ones of these apertures to form unique keys defining the type of circuit board to be inserted into the receptacle.

Each spring device has two projections, such as 14 and 15 on device 13, which intersect the plane to the occupied by a board when inserted. Two pairs of indentations are located on the board near its edge associated with a guide rail and each pair is associated with one of the spring devices. One such pair is shown in FIG. 1 as indentations 16 and 17 which are associated with spring device 13. The other pair (not shown in FIG. 1) is located on the opposite side of the board as that containing indentations 16 and 17 and are associated with spring device 37. By way of example, board 1 in FIG. 1 is assumed to be the correct type of board for insertion into the receptacle comprising guide rail 2. In the preferred embodiment, the locations of the spring devices in guide rail 2 and the locations of the pairs of indentations on the board are selected such that the projections on the spring devices align with and are received by their associated indentations when board 1 is completely inserted. As will be seen, however, if an attempt is made to insert an incorrect type of board into the receptacle, the projections of one of the spring devices will be received prematurely by a pair of indentations and further insertion of the board will be prohibited.

The location of the apertures 6 along guide rail 2 are selected in accordance with an encoding scheme similar to that in the aforementioned Grau et al disclosure. Grau et al locates a stop at one of a plurality of first locations along one guide rail, such as guide rail 2, and another stop at one of a plurality of associated second locations along another guide rail, such as 3. Associated ones of the first and second locations are ordered in opposite directions. Projections, or pegs, are located on the board in the same spacial relationship as the stops.

In the instant arrangement, the locations of the apertures along guide rail 2 correspond to both the first and second locations in Grau et al. The apertures are symmetrical about a plane bisecting the guide rail in the direction of board insertion. One side of the apertures so bisected corresponds to the plurality of first locations in Grau et al, which are here designated as A through H in FIG. 1. The other side of the apertures so bisected correspond to the plurality of second locations in Grau et al and are here designated A' through H' in FIG. 1. As shown, the A through H locations and the A' through H' locations are ordered in opposite directions along guide rail 2 as taught by Grau et al. Each one of the A through H locations is individually associated with the correspondingly designated locations A' through H'. Each pair of associated locations, such as A-A', B-B', C-C', etc, define a unique circuit board key. Thus, the illustration of FIG. 1, involving only guide rail 2 for the present discussion, defines 8 unique circuit board keys A-A' through H-H'. If a receptacle is to be encoded A-A', for example, a spring device is inserted into location A of one of the apertures 6 and a second spring device is inserted into location A' of the associated aperture. The locations of pairs of indentations on an A-A' board to be inserted into this A-A' receptacle would correspond spatially on the board to the A-A' locations of the spring devices.

The number of keying combinations may be squared by also encoding guide rail 3 in a manner as described above for guide rail 2. If this is done, guide rail 3 is identical in structure to guide rail 2, except for the selected locations of spring devices. Board 1, of course, would also contain two additional pairs of indentations located along its bottom edge associated with guide rail 3 for the two spring devices that would be located in the guide rail.

Figure 2:
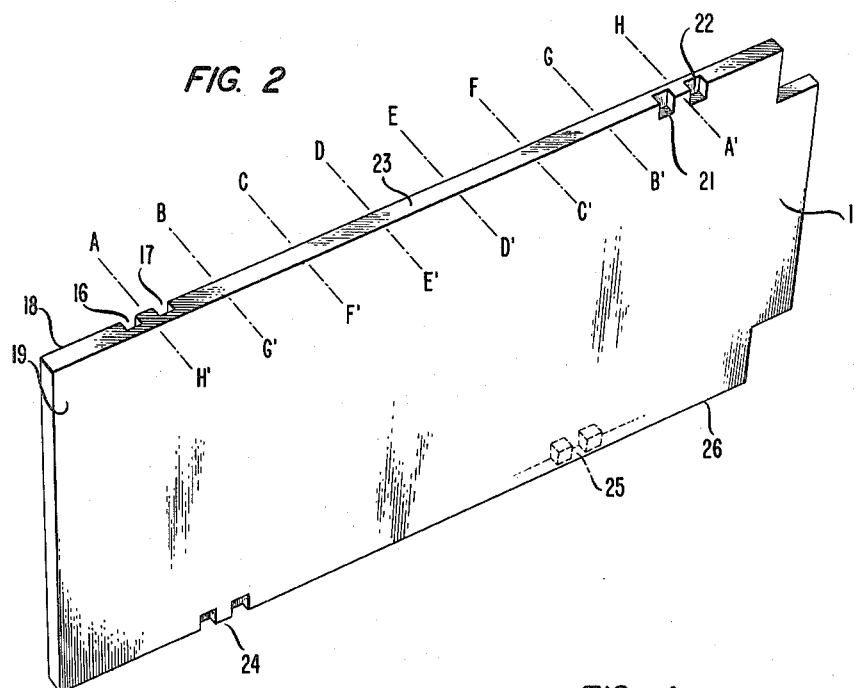
FIG. 2 shows a circuit board containing pairs of indentations which receive associated ones of the spring device projections of FIG. 1 during insertion of an incorrect type of board.

FIG. 2 discloses circuit board 1 in more detail and, with reference to the upper edge of the board, illustrates the locations of indentations along both sides of the board corresponding to locations A through H and A' through H'. As in FIG. 1, this part of the board is encoded A-A' for illustrative purposes. Accordingly, indentations 16 and 17 are located on side 18 of the board at location A and a second pair of indentations 21 and 22 (not shown in FIG. 1) are located at A' on side 19 of the board. Each indentation extends part way through the board from the side of the board on which it is located and down from the edge 23 of the board a sufficient distance to accommodate its associated projection on spring devices 13 and 14 in FIG. 1. For completeness, FIG. 2 also discloses two other pairs of indentations 24 and 25 located on both sides of the board along the bottom edge 26 thereof. These indentations are illustratively encoded B-B' and would be associated with spring devices in apertures of guide rail 3 of FIG. 1.

Figure 3:
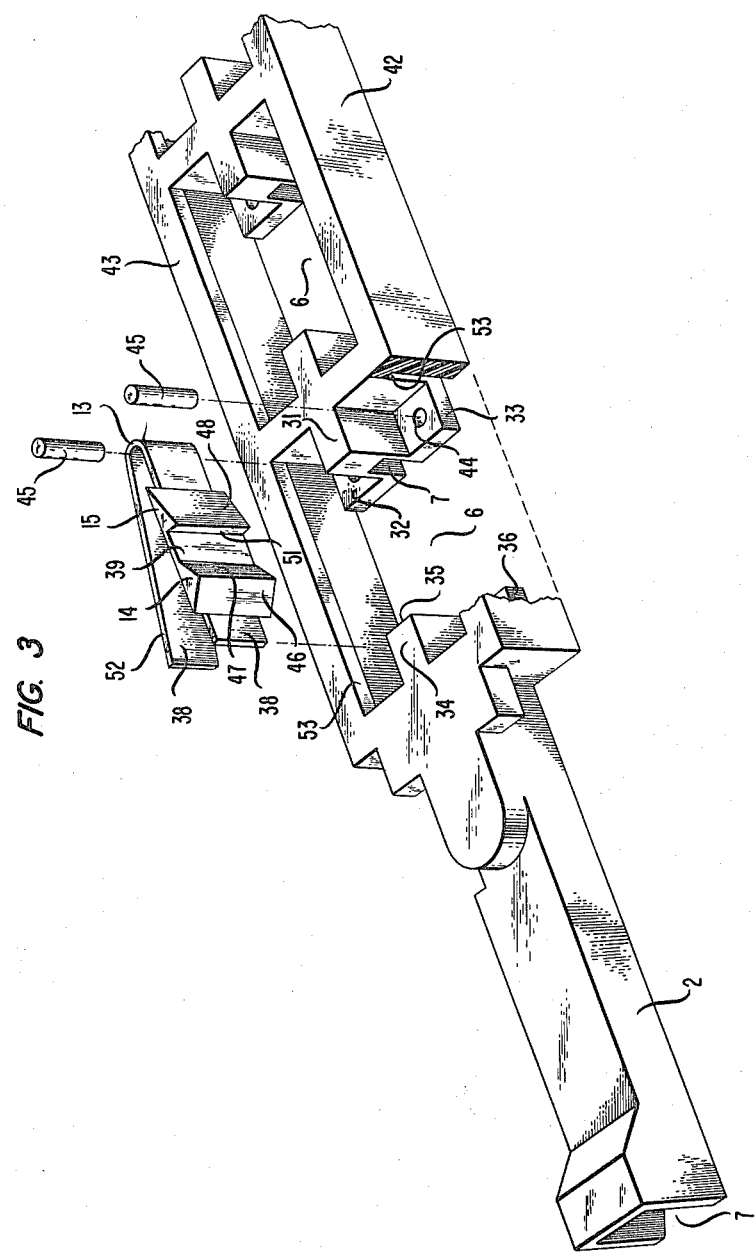
FIG. 3 shows the details of a spring device and a cut-away view of a portion of a guide rail revealing the structural details of the guide rail and apertures of FIG. 1.

FIG. 3 contains a cut-away drawing of a guide rail, such as 2, illustrating the detailed construction of the guide rails and spring devices. Each aperture 6 is formed by internal surfaces of the side walls of the guide rail and by end members 31 through 36 contained in each aperture. Members 32, 35 and 36 are structurally identical to member 33. End member 35 is not visible in FIG. 2, but would be located opposite member 32, as member 36 is opposite member 33. Also as seen in the figure, portions of these members combine to define part of channel 7. The underside of these members may be seen in FIG. 1 as part of the structure of guide rail 3. Each of the members 32, 33, 35 and 36 contain a hole, such as 44, in which a pin, such as pin 45, may be anchored. If desired, the pins may be molded as an integral part of a guide rail. A spring device, such as 13, fits concentrically over one of the pins as shown in FIG. 3. The pin aids in providing retaining strength for the spring device in the aperture.

Spring device 13 comprises a spring member 38 and a projection member 39 bonded to or stamped and formed as part of a portion of the spring member. The projection member comprises projections 14 and 15. Projection 14 has leading and trailing cam surfaces 46 and 47, both of which are sloped. Projection 15 has a sloped trailing cam surface 48 and an abrupt leading surface 51. In this illustrative embodiment, the abrupt surface 51 extends at right angles from the spring member 38.

The spring member 38 may be made of numerous resilient materials, such as beryllium copper, a phosphorus-bronze alloy or a resilient plastic. Spring device 13 is inserted over a pin 45 and into the aperture by compressing the spring member 38. When the device is inserted, its top surface 52 snaps under the shoulder 53 which forms part of the internal wall of the aperture. This shoulder and members 35 and 32, in the example of FIG. 3, retain the device within the aperture.

Figure 4:
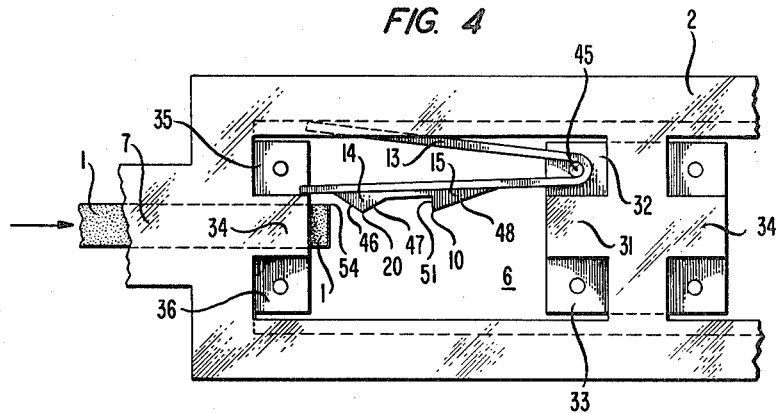
FIGS. 4 and 5 illustrate the operation of a spring device during insertion of a board and after board indentations have received their respective spring device projections.

During insertion of a board into a receptacle, the spring device operates as shown in FIG. 4. This figure shows a top view of a portion of guide rail 2 and spring device 13. Board 1 is shown partially inserted along guide rail 2 such that it has almost reached initial projection 14. Both projections 14 and 15 protrude into the portion of aperture 6 that is in the path of insertion of board 1. After the leading front edge 54 of the board contacts the leading cam surface 46 of projection 14, further insertion of the board compresses device 13 as the edge 54 moves forward along projection surface 46 until the board is inserted past the tip 20 of projection 14. The tip 20 then slides on the surface of the board as it is inserted further.

Figure 5:
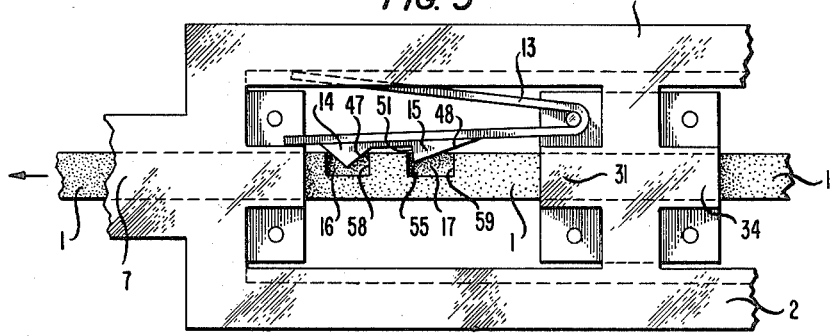

When board insertion has progressed to the point that indentation 17 (shown in FIG. 1 and not shown in FIG. 4) passes under tip 20, tip 10 of projection 15 then contacts and slides over the board to maintain compression of the spring device and prevent projection 14 from dropping into indentation 17. As board 1 is further inserted, indentations 16 and 17 in FIG. 1 pass under projections 14 and 15, respectively, at which time the projections are received by these respective indentations. This is shown in FIG. 5. Abrupt surface 51 of projection 15 engages the abrupt shoulder 55 of indentation 17 and prevents further insertion of the board.

The spring device at location A' in FIG. 1 operates in the same manner as described aobve with respect to its indentations (not shown) located on the side of the board opposite to that containing indentations 16 and 17.

Withdrawal of an inserted board is accomplished without interference from the spring device by means of the trailing cam surfaces of the projections on the devices. With reference to FIG. 5, as board 1 is withdrawn, the trailing shoulders 58 and 59 of indentations 16 and 17 contact the respective trailing surfaces 47 and 48 of projections 14 and 15. Since these surfaces are sloped, rather than abrupt, the shoulders compress spring device 13 and the tips 20 and 10 of the projections slide on the surface of the board until it is completely withdrawn.

In the illustrative embodiment described above, a pair of associated spring devices are located on the same guide rail. This is an arbitrary selection. For example, in FIG. 1, one spring device could be located at A on guide rail 2 and its associated device could be located at A' on guide rail 3. With this selection, the associated spring devices could also be located on the same side of a guide rail and board. These different arrangements are functionally equivalent with one having no known advantage over the other.

FIG. 6 shows another illustrative embodiment of a guide rail 61 in which spring devices 62 and 63 are molded as an integral part of the side walls 65 and 66 of a guide rail. This guide rail may be formed from metal or preferably plastic material which is resilient in the areas designated as 64. These are the areas of flexing of the spring devices 62 and 63 as circuit boards are inserted and withdrawn along the guide rail. The most salient feature of this embodiment is that the width of the guide rail may be substantially less than that of the aforementioned embodiment. This, in turn, has the obvious advantage of allowing a greater circuit board packing density in a frame.

It is to be understood that the hereinbefore described arrangements are illustrative of the application of principles of the invention. In light of this teaching, it is apparent that other arrangements may be devised by those skilled in the art without departing from the spirit and scope of the invention.

I claim:

1. For use with plug-in circuit boards (FIG. 1: 1) and circuit board receptacles (2, 3, 4), each receptacle having first and second guide rails (2, 3) for guiding the insertion of boards into the receptacles, a keying arrangement for preventing the insertion of boards into any but correct receptacles, CHARACTERIZED IN THAT the first and second guide rails of each receptacle aggregately comprise at least first and second spring devices (13, 37) located at prescribed ones of a plurality of coded locations (A through H, A' through H') along the guide rails, each said device having a projection, and each said board contains first and second indentations (FIG. 2: 17 and 22) located at predetermined ones of a plurality of coded locations on the board corresponding to the coded locations along the guide rails, the prescribed and predetermined locations of the spring devices and indentations being selected such that the devices and indentations do not interfere with the insertion of a correct board, and a board indentaion receives a projection to block the insertion of an incorrect board.

2. For use with plug-in circuit boards (FIG. 1: 1) and circuit board receptacles (2, 3, 4), each receptacle having first and second guide rails (2, 3), each guide rail having a channel 7 for guiding the insertion of boards into the receptacles, a keying arrangement for preventing the insertion of boards into any but correct receptacles, CHARACTERIZED IN THAT the first and second guide rails of each receptacle aggregately comprise at least two spring devices (13, 37) located at prescribed ones of a plurality of coded locations (A through H, A' through H') along the guide rails, each device having first and second projections (14, 15), and each said board contains a different set of first and second indentations (16, 17) for each said spring device, the first and second indentations for a given spring device being associated, respectively, with the first and second projections of that spring device, the first projection being adapted to allow initial insertion of a board into a receptacle without interference between the leading board edge and the second projection, and the spring devices and indentations being adapted such that both projections of one spring device are received by their respective associated indentations during an attempt to insert an incorrect board, the second projection acting with its respective indentation to prevent further insertion of the board.

3. The invention of claim 2 wherein the first guide rail contains a plurality of apertures (FIG. 1: 6) extending through the guide rail and defining said plurality of coded locations, each aperture being capable of retaining a said spring device.

4. The invention of claim 4 in which each of the apertures of the first guide rail are symmetrical about a plane bisecting the first guide rail in the direction of board insertion, the portions of the apertures on one side of the first guide rail so bisected form a first group of said locations (FIG. 1: A–H) and the portions of the apertures on the remaining side of the first guide rail so bisected form a second group of said locations (A'–H'), a first one of said spring devices is located in one (A) of said first group of locations, a second one of said spring devices is located in an associated one (A') of said second group of locations, each of the locations in the first group being associated with a different one of the locations in the second group and associated locations in the first and second groups being ordered in opposite directions, wherein each pair of associated locations defines a unique circuit board key, the first and second indentations (FIG. 2: 16, 17) associated with the first spring device are located on a side of said board corresponding to the first spring device, and in which said board further comprises third and fourth indentations (21, 22) associated with said second spring device, said third and fourth indentations being located on a side of the board corresponding to said second spring device.

5. The invention of claim 4 wherein the first guide rail comprises side walls (FIG. 3: 42, 43), shoulders in the side walls (53) and end members (31–36) within each of the apertures for retaining said spring device in its aperture.

6. The invention of claim 5 wherein the end members aggregately define a part of said channel for guiding the insertion of said board.

7. The invention of claim 5 wherein a said spring device comprises a U-shaped member (FIG. 3: 38) made of resilient material, said U-shaped member having two leg members forming the legs of the U, one of said leg members being capable of fitting under a said side wall shoulder to retain it within said aperture.

8. The invention of claim 7 in which said first and second projections on said spring device are fixedly attached to the remaining one of said leg members.

9. The invention of claim 8 in which a prescribed one of said aperture end members (32) comprises a pin (45) for receiving the U-shaped portion of said spring device joining said leg members.

10. The invention of claim 2 wherein said guide rails are made of a resilient material and comprise side walls forming said channel, wherein a said spring device (FIG. 6: 62) is formed as an integral part of one of the side walls, one end (64) of said spring device forming part of said side wall and being flexibly connected thereto, the opposite end of said spring device being unconnected to the continuation of said side wall.

11. The invention of claim 10 in which the first and second projections of each spring device intersect the plane of insertion of a board into the receptacle and in which each first projection has a leading cam surface (FIG. 4: 46) operative to compress its associated spring device upon initial contact with a board, whereby the first projection slides on the surface of the board while the associated spring device is compressed to allow further insertion of the board.

12. The invention of claim 11 in which the spacing between the first and second indentations is selected to allow the associated first and second projections to be received simultaneously into the first and second indentations, respectively, and the indentations have a prescribed width selected so that as the first projection (14) passes over the second indentation (17) prior to alignment of the first and second projections with their respective associated first and second indentations during further insertion of the board, the second projection (15) slides on the surface of the board to maintain the spring device in compression.

13. The invention of claim 12 in which the second indentation (17) has an abrupt trailing surface (55) and the second projection (15) has an abrupt leading surface (51) which operates with the abrupt trailing surface after the second projection is received by the second indentation to prevent further insertion of the board.

14. The invention of claim 13 in which the first and second projections both have trailing cam surfaces (47, 48) operative to allow the compression of the associated spring device for lifting the projections out of their respective indentations during withdrawal of the board from the receptacle.

* * * * *